United States Patent [19]
Sumner

[11] Patent Number: 6,137,749
[45] Date of Patent: Oct. 24, 2000

[54] APPARATUS AND METHOD FOR MEASURING TIME INTERVALS WITH VERY HIGH RESOLUTION

[75] Inventor: Richard L. Sumner, Pomona, N.Y.

[73] Assignee: LeCroy Corporation, Chestnut Ridge, N.Y.

[21] Appl. No.: 09/155,670

[22] PCT Filed: Apr. 1, 1997

[86] PCT No.: PCT/US97/05299

§ 371 Date: Dec. 18, 1998

§ 102(e) Date: Dec. 18, 1998

[87] PCT Pub. No.: WO97/39360

PCT Pub. Date: Oct. 23, 1997

Related U.S. Application Data

[60] Provisional application No. 60/014,694, Apr. 2, 1996.

[51] Int. Cl.[7] .............................. G04F 8/00; G04F 10/00; H03K 5/18
[52] U.S. Cl. ............................................. 368/113; 368/118
[58] Field of Search .................................... 368/113–121; 327/1.3

[56] References Cited

U.S. PATENT DOCUMENTS

| | | |
|---|---|---|
| 4,408,895 | 10/1983 | Geesen . |
| 4,772,843 | 9/1988 | Asaka et al. . |
| 4,975,636 | 12/1990 | Desautels . |
| 5,184,128 | 2/1993 | Snow . |
| 5,200,933 | 4/1993 | Thornton et al. . |

OTHER PUBLICATIONS

V.A. Bespal'Ko, "Interpolator For Precision Time Interval Meters" Measurement Techniques, vol. 36, No. 4, Apr. 1, 1993, pp. 387–392.

J. Kalisz et al., "Precision Time Counter For Laser Ranging To Satellites", Review Of Scientific Instruments, vol. 65, No. 3, Mar. 1, 1994, pp. 736–741.

J. Kalisz et al., "Improved Time–Interval Counting Techniques For Laser Ranging Systems", IEEE Transactions on Instrumentation and Measurement, vol. 42, No. 2, Apr. 1, 1993, pp. 301–303.

*Primary Examiner*—Vit Miska
*Attorney, Agent, or Firm*—Frommer Lawrence Haug, LLP; William S. Frommer

[57] ABSTRACT

To measure relatively long time intervals with very high resolution, apparatus and method operate to receive a first pulse and a clock signal that has a known period, synchronize the first pulse with the clock signal, stretch the first synchronized pulse in accordance with a first stretch ratio, produce a first compared output pulse corresponding to the first stretched signal, synchronize the first compared output pulse with the clock signal, generate a first pulse sequence from the first synchronized pulse and the first synchronized compared output pulse, convert times of occurrences of the edges of the first pulse sequence to respective time values, receive a second pulse and generate a second pulse sequence in a manner similar to that of the first pulse sequence, convert times of occurrences of the edges of the second pulse sequence to respective time values, count the elapsed number of clock periods between the first and second synchronized pulses, derive the time interval between the received pulses from the time values, the first and second stretch ratios, the period of the clock and the elapsed number of clock periods, and calibrate the first and second stretch ratios from the time values.

48 Claims, 4 Drawing Sheets

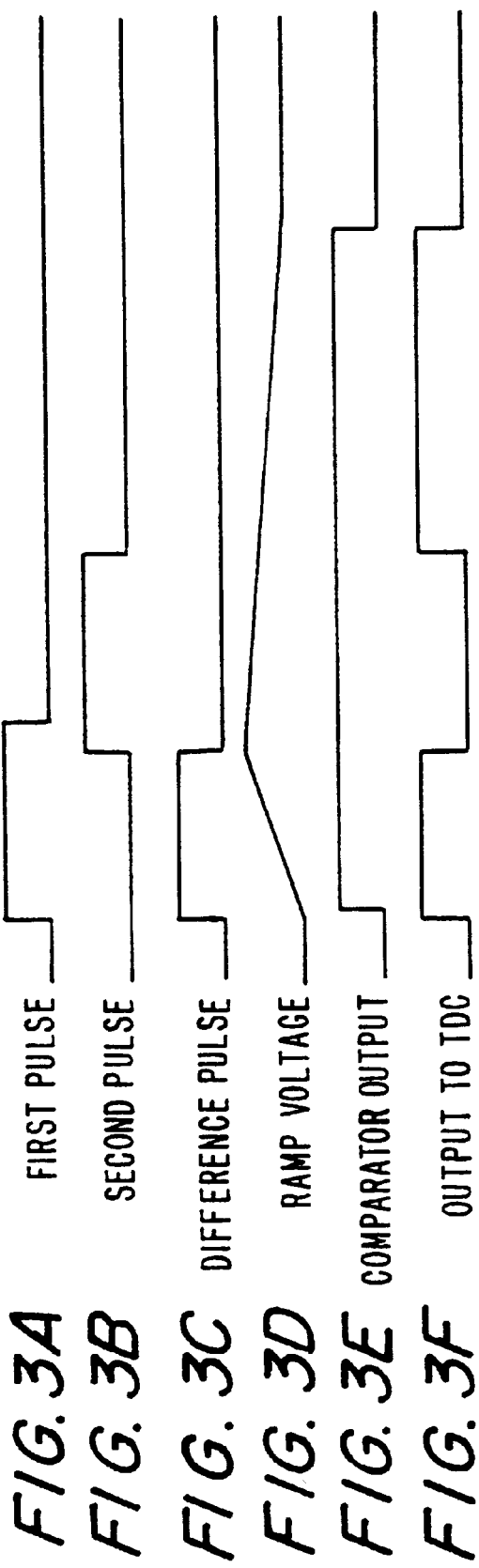

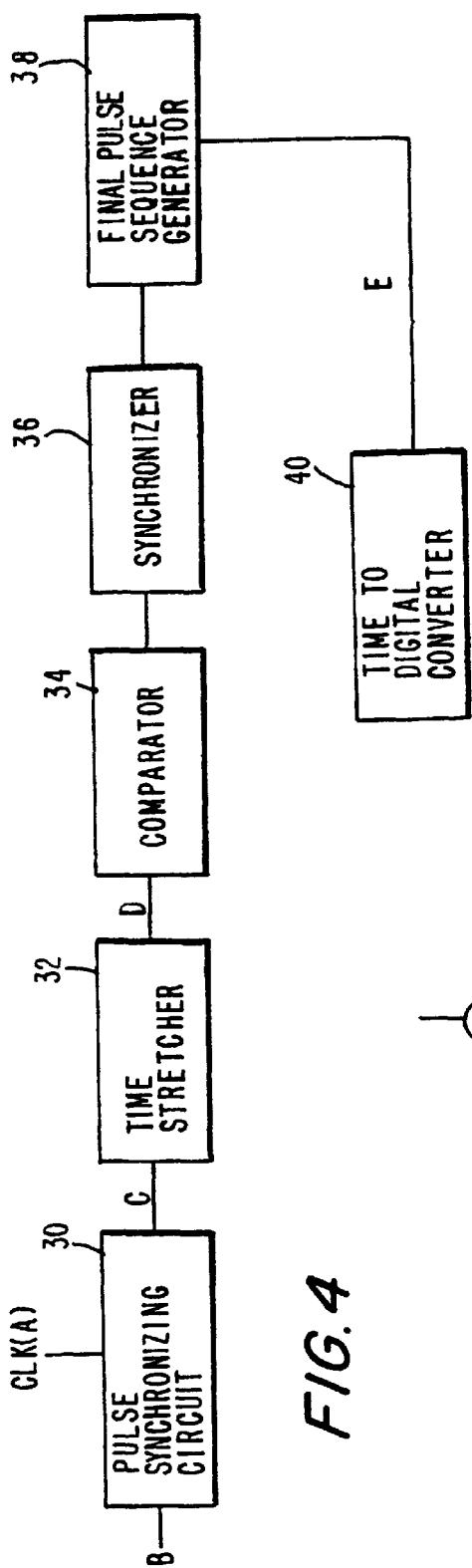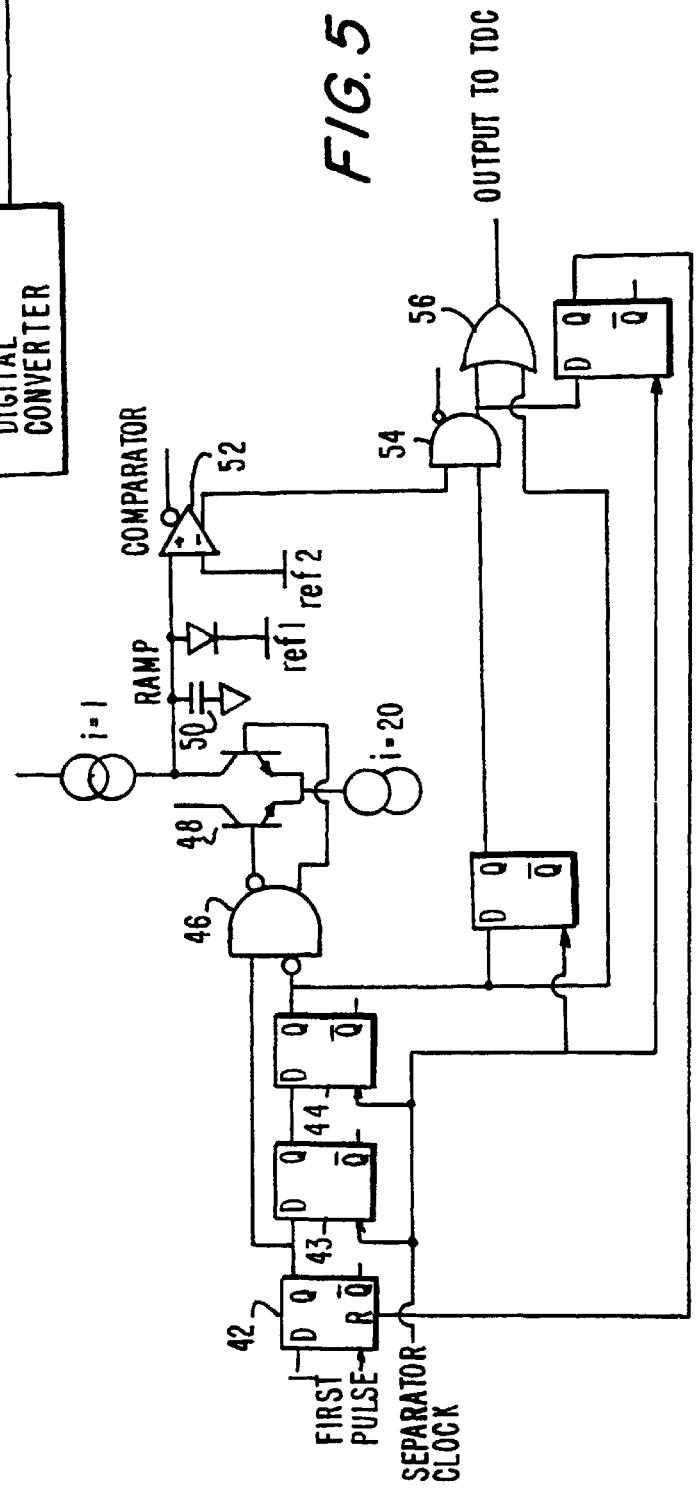

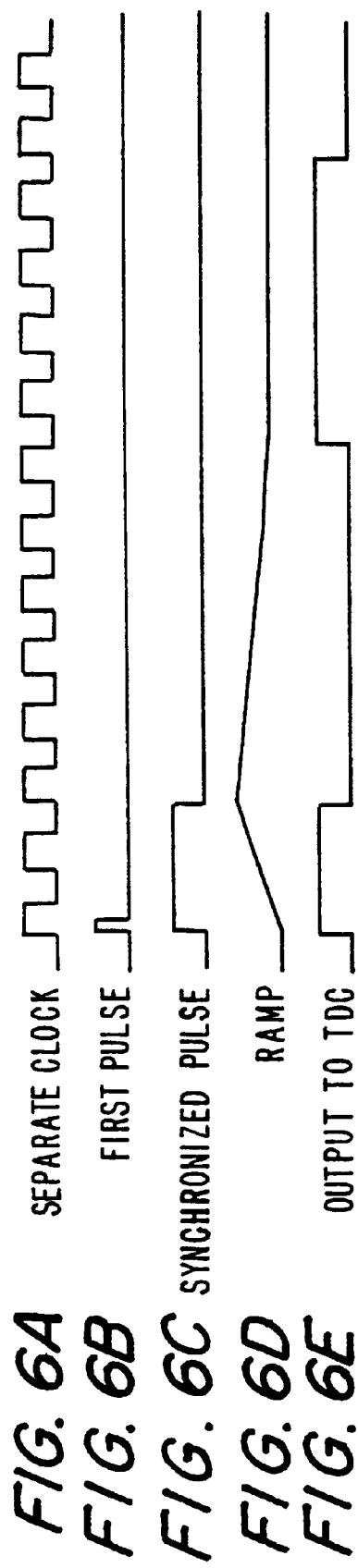

APPARATUS AND METHOD FOR MEASURING TIME INTERVALS WITH VERY HIGH RESOLUTION

RELATED APPLICATION

This application claims the benefit of U.S. Provisional Application Ser. No. 60/014,694, filed Apr. 2, 1996.

BACKGROUND OF THE INVENTION

The present invention relates to a technique for measuring time intervals with very high resolution and, more particularly, to apparatus and method for measuring time intervals with very high resolution using a time stretcher with a a time digitizer.

High resolution time measurements are used, for example, in particle physics experiments to measure particle velocity. When the velocity and momentum (measured by bending in a magnetic field) of a particle is known, the mass of that particle can be calculated. The velocity in such experiments is calculated from a time of flight measurement over a known flight path, wherein the time resolution should be better than the resolution of the particle detector, which generally has a maximum resolution of 100 picoseconds. Unfortunately, the time ranges in such particle physics experiments generally are less than 100 nanoseconds.

Other fields of instrumentation in which high resolution measurements are taken include high speed digital sampling oscilloscopes, e.g., the random interleaved sampling type, which may measure the time interval between a trigger pulse and a sampling clock to a resolution that is better than the equivalent sampling period, which may be only a few picoseconds. Other instrumentation includes a laser ranging instrument (LIDAR) which often requires a resolution of less than 100 picoseconds corresponding to, for example, a distance of 16 mm, over a range of several microseconds.

One known technique for measuring time intervals is to electronically count a clock down to resolutions of order 1 nanosecond, but the resolution is limited by the clock frequency and the ability to correctly count the clock. For a resolution of 1 nanosecond, a 1 GHz clock is required.

Another technique for measuring time intervals employs the digital interpolation of a slower clock, such technique achieving an RMS resolution that is better than 300 picoseconds using a 250 MHz clock. A further technique involves converting the time interval to a voltage or charge and then measuring that voltage or charge with an analog to digital (ADC) converter. A time to amplitude converter (TAC) followed by an ADC suitably measures time in this manner.

Still another technique for measuring time intervals with high resolution is to use a time amplitude converter followed by a Wilkinson type ADC, which converts the amplitude into a time and measures the time by directly counting a clock with a scaler. By utilizing a time stretcher, the time interval to be measured is converted into a proportionally longer time interval and the longer time interval is then measured, such measurement being reduced in scale by the amount of "stretch" of the time stretcher so as to produce the time interval between two events.

In the above-discussed time measuring techniques, the maximum time range that can be measured is a function of the resolution of the ADC and the desired time resolution. For example, given a 12 bit ADC and a resolution of 25 picoseconds, the maximum time interval that may be measured is only 100 nanoseconds.

One problem with the above-discussed time measuring techniques is that such techniques and methods are "common start" or trigger methods in which the circuits are armed with a start signal, which enables the stop input. While measuring the time interval between the start signal and stop input after it is armed is sufficient for many laboratory measurements in which the signals to be measured may be arranged as required, such common start measurement is unsuitable to satisfy the time measuring requirements of time of flight measurements in particle physics experiments. In such experiments, there are usually many particles passing through particle detectors and only selected particles are to be measured. Since there are many extraneous signals, a trigger decision is required, which involves providing a trigger signal after the event has occurred. This may be achieved by delaying the signal to be measured by a relatively long amount of time so as to allow for trigger formation and distribution, but such a signal delay requires a relatively long, high bandwidth and expensive delay line in each signal channel.

Another problem with the above-discussed time measuring techniques is that they record only a single hit. Since multiple hits on a channel are not easily accommodated, the system (i.e., the time measuring device) must be reset after each measurement.

A further problem encountered in typical time measuring devices is that they are generally difficult to calibrate. Offset calibration and gain calibration (e.g., the time stretching ratio) must be carried out for each measuring channel, wherein the offset must always be calibrated by the user since the relative signal paths from the signal sources to the measuring instrument must be included in the offset. However, the scale factor (i.e., the gain) is not easily measured and usually requires creating test pulses with an accurately known variable time delay. Since such calibration requires a special test setup, it is usually performed at a service bench. Further, calibration of the integral linearity requires multiple measurements over the entire range of the instrument. Unfortunately, calibrating the time measuring device at a service bench requires that it be quite stable over time and with respect to its environment in order for the calibration to remain valid.

OBJECTS OF THE INVENTION

Therefore, it is an object of the present invention to provide apparatus and method for measuring time intervals with very high resolution which overcome the shortcomings of the above-described devices.

Another object of the present invention is to provide a technique for measuring time intervals with very high resolution in which both common start and common stop operation are possible.

A further object of the present invention is to provide a time interval measuring device in which multiple measurements per channel are possible with modest dead time.

An additional object of this invention is to provide apparatus and method for measuring time intervals with very high resolution in which the time scale may be calibrated using normal data only.

Still another object of the present invention is to provide apparatus and method for measuring time intervals with very high resolution that may be completely calibrated in situ and wherein continuous calibration using the data itself can track slow changes in the scale factor thus obviating the need for a high stability design.

Various other objects, advantages and features of the present invention will become readily apparent to those of ordinary skill in the art, and the novel features will be particularly pointed out in the appended claims.

SUMMARY OF THE INVENTION

In accordance with one embodiment of the present invention, apparatus and method are provided for generating a difference pulse representing a difference between first and second received pulses, stretching the difference pulse in accordance with a stretch ratio, producing a compared output pulse corresponding to the stretched signal, generating a pulse sequence that has a first edge that corresponds to the first pulse, a second edge that corresponds to the second pulse, and another edge that corresponds to the compared output pulse (i.e., the end of the stretched signal), converting times of occurrences of each of the edges to respective time values, deriving the time interval between the received first and second pulses from the time values and the stretch ratio, and calibrating the stretch ratio from the time values.

As one aspect of the present invention, the difference between the second and other time values is calculated and the difference therebetween is divided by the stretch ratio to derive the time interval between the first and second pulses.

As another aspect of the present invention, the difference between the second and other time values is calculated to produce the stretched time interval, the difference between the first and second time values is calculated to produce the unstretched time interval, and the stretch ratio is calibrated from the stretched time interval and the unstretched time interval.

As yet a further aspect of the present invention, the stretch ratio is calibrated from the converted time values of a plurality of time interval measurements of a plurality of first and second pulses (e.g., by averaging the stretch ratio of the measurements).

As yet another aspect of the present invention, a stop signal is received after the pulses are received, and a respective time difference between each edge of the pulse sequence and the stop signal is ascertained so as to produce the respective time values.

In accordance with another embodiment of the present invention, apparatus and method are provided for receiving a first pulse and a clock signal having a predetermined known period, synchronizing the first pulse with the clock signal, stretching the first synchronized pulse in accordance with a first stretch ratio, producing a first compared output pulse corresponding to the first stretched signal, synchronizing the first compared output pulse with the clock signal, generating a first pulse sequence from the first synchronized pulse and the first synchronized compared output pulse, converting times of occurrences of each edge of the first pulse sequence to respective time values, receiving a second pulse, synchronizing the second pulse with the clock signal, stretching the second synchronized pulse in accordance with a second stretch ratio, producing a second compared output pulse corresponding to the second stretched signal, synchronizing the second compared output pulse with the clock signal, generating a second pulse sequence from the second synchronized pulse and the second synchronized compared output pulse, converting times of occurrences of each edge of the second pulse sequence to respective time values, determining (e.g., counting) the elapsed number of clock periods between the first and second synchronized pulses, deriving the time interval between the received first and second pulses from the time values, the first and second stretch ratios, the period of the clock and the elapsed number of clock periods, and calibrating the first and second stretch ratios from the time values.

As one aspect of this embodiment of the present invention, the length in time of the first synchronized pulse is derived from the time values and the first stretch ratio, the length in time of the second synchronized pulse is derived from the time values and the second stretch ratio, the period of the clock is multiplied by the elapsed number of clock periods to calculate the time interval between the first and second synchronized pulses, and the time interval between the received first and second pulses is derived from the lengths of the first and second synchronized pulses and the time interval between the first and second synchronized pulses.

As another aspect of this embodiment, the time intervals of the two stretched signals and the two unstretched signals are derived from the time values, and the first and second stretch ratios are calibrated from the stretched and unstretched time intervals.

As yet a further aspect of this embodiment, the period of the clock signal is accurately measured from some of the time values and the predetermined known period.

As yet another aspect of this embodiment, the first and second synchronized pulses are each stretched by a predetermined number of periods of the clock signal, and the clock signal used to convert the edges of the pulse sequences to time values is the same clock signal used to synchronize the pulses.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which:

FIGS. 3A–3F are various signal waveforms used to explain the operation of the time interval measuring apparatus of FIG. 1 in accordance with the present invention;

FIG. 4 is a block diagram of a time interval measuring apparatus in accordance with another embodiment of the present invention;

FIG. 5 is a schematic illustration of an exemplary circuit of the device of FIG. 4; and FIGS. 6A–6E are various waveforms used for explaining the operation of the time interval measuring apparatus shown in FIG. 4 in accordance with the present invention.

DETAILED DESCRIPTION OF CERTAIN PREFERRED EMBODIMENTS

The time interval measuring apparatus and method of the present invention combines the functions of a standard time stretcher with those of a high-speed, pipelined, multiple hit, time digitizer to measure time intervals with very high resolution. An exemplary time digitizer is Lecroy's MTD133 monolithic integrated circuit which is an 8 channel device, fabricated in CMOS, and which has an LSB (least significant bit) of 500 picoseconds and a maximum measurement time range of 32 microseconds. Each channel of the MTD133 can store up to 16 measurements within the 32 microsecond time range, and the double hit resolution (the dead time for a measurement to be recorded) is less than 10 nanoseconds. The exemplary MTD133 uses a tapped delay line to interpolate within the 4 nanosecond period of its 250 MHz clock to achieve the 500 picosecond LSB, and the common reference input of the MTD133 can be either common start or common stop. The output data are the time differences between the common reference and the signal inputs. It is appreciated that although the present invention is described as utilizing a time digitizer having the capabilities of the MTD133 integrated circuit, other suitable time digitizers may also be utilized.

As mentioned above and as will be seen from the following description, the present invention has many advantages over traditional high resolution timing methods. For example, both common start and common stop operations are possible in the described embodiments, multiple measurements per channel are possible with only modest dead time, calibration of the time scale of the present invention is possible without requiring special calibration signals, and a high stability design is not necessary to carry out the present invention, whereby the apparatus can be completely calibrated in situ and continuous calibration using only the data itself can track changes in the scale factor.

Figure 1:
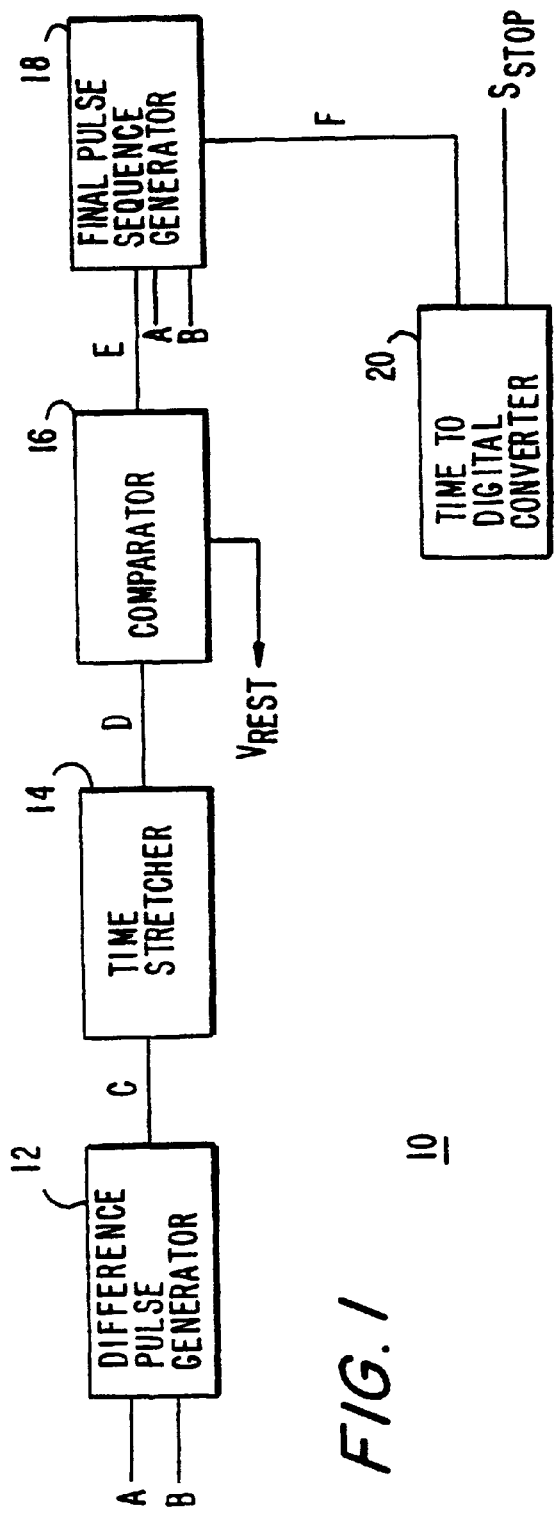
FIG. 1 is a block diagram of apparatus for measuring time intervals in accordance with the present invention.
Figure 2:
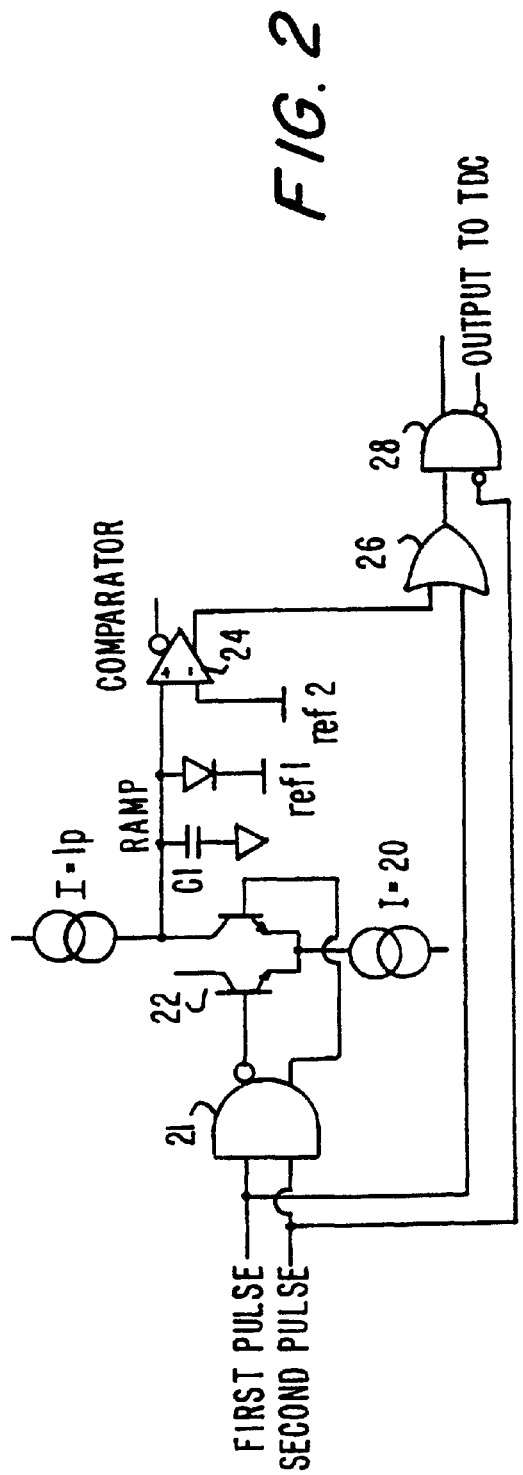
FIG. 2 is a schematic illustration of an exemplary circuit of the block diagram shown in FIG. 1 in accordance with the present invention.

Referring now to the drawings, FIG. 1 is a block diagram of apparatus for measuring time intervals with very high resolution in accordance with a first embodiment of the present invention. For purposes of convenience, the time measuring device of FIG. 1 is referred to herein as "simple time stretcher 10". An exemplary simple time stretcher is shown in FIG. 2 of the drawings. Simple time stretcher 10 measures the time difference between a first event, which is a randomly occurring signal pulse (a first pulse), such as shown in FIG. 3A of the drawings, and which is supplied from a detector (not shown), and a second event, which is a trigger pulse (a second pulse) (shown in FIG. 3B) which indicates that an interesting event has occurred. Generally, the time difference between the occurrence of the first pulse (i.e., the positive-going edge of that pulse) and the occurrence of the second (or trigger) pulse (i.e., the positive-going edge of that pulse) should be greater than some minimum value which is determined by the double pulse resolution of the time to digital converter being utilized (e.g., the MTD133).

This minimum value is approximately 10 nanoseconds for the MTD133 time digitizer. Also, the widths of the two pulses both should be slightly longer than the maximum time difference therebetween that is expected.

Referring to both FIGS. 1 and 2, the first pulse A and the trigger pulse B are supplied to a difference pulse generator 12 (FIG. 1), comprised of, for example, gate 21 and transistor pair 22 in FIG. 2, which generates therefrom a "difference" pulse, which is equal to, in Boolean form, (first pulse) AND (NOT (trigger pulse)), as shown in FIG. 3C. As shown, the difference pulse begins at the leading edge of the first pulse time and ends at the leading edge of the trigger pulse time.

The difference pulse signal is supplied to a capacitance circuit (i.e., time stretcher 14) which includes therein a capacitor (e.g., capacitor C1 in FIG. 2) which is charged, for example, by integrating a constant current source into the capacitor, during the existence of the difference pulse. During this time, the capacitor voltage steadily increases to produce a ramp voltage, such as shown in FIG. 3D. At the trailing edge of the difference pulse, the ramp voltage has peaked and is caused to decrease steadily thereafter by removing the accumulated charge in the capacitor with a relatively smaller current source of the opposite polarity with respect to the constant current source previously supplied to charge the capacitor. The ratio of the constant current source that charged the capacitor to the smaller current source that discharged the capacitor defines the time stretching ratio. The capacitor voltage, illustrated in FIG. 3D, is supplied from time stretcher 14 as the ramp voltage D.

The ramp voltage D is supplied to a comparator 16, e.g., comparator 24 in FIG. 2, which turns on when the capacitor voltage is slightly different from the capacitor's resting state voltage ($V_{REST}$ or ref2) also supplied thereto so as to provide a high output when the capacitor is slightly charged, such as shown in FIG. 3E. As shown, the comparator supplies an output pulse (also referred herein as "pulse 4") which extends from when the capacitor is initially charged to when the capacitor is fully discharged.

The comparator's output (pulse 4), as well as the first pulse A and the trigger pulse B, are supplied to a final pulse sequence generator 18, e.g., gates 26 and 28 in FIG. 2, which produces therefrom a "final" pulse sequence, such as shown in FIG. 3F. The generated final pulse sequence is equal to [(pulse 1) OR (pulse 4)] AND (NOT (pulse 2)). The final pulse sequence F contains four transitions (edges) which are supplied to a single channel of a time to digital converter 20, e.g., the MTD133 time digitizer. As is clear from the above description, the first edge of the final pulse sequence occurs at the leading edge of the first pulse, the second edge occurs at the leading edge of the trigger pulse, the third edge occurs at the trailing edge of the trigger pulse, and the fourth edge occurs when the comparator turns off (i.e., the capacitor is fully discharged). When the comparator turns off, and the capacitor voltage has returned to its resting state, the simple time stretcher is ready for another pair of input pulses.

Time to digital converter 20, after receiving the four edges, receives a common stop signal $S_{STOP}$ which is derived from the trigger pulse and further trigger qualifications and which controls the simple time stretcher 10 to calculate the time difference between the first pulse and the trigger pulse from the four edges that are supplied to time to digital converter 20 (to be described). It is appreciated that the exact time that common stop signal $S_{STOP}$ is supplied to time to digital converter 20 is not important for purposes of the present invention. As will be seen from the ensuing description, each of the four edges of the final pulse sequence is measured with 500 picoseconds quantizing and a resolution that is better than 300 picoseconds RMS.

At the occurrence of the common stop signal $S_{STOP}$ time to digital converter 20 ascertains the respective time difference between each of the edges of the final pulse sequence and the common stop signal to provide four time difference times. The time difference between the occurrences of the first pulse and the trigger pulse is ascertained with very high resolution by calculating the difference between the times of occurrence of the second and fourth edges of the final pulse sequence and dividing the calculated time difference by the stretch ratio. As previously discussed, the stretch ratio is the ratio of the capacitor's charging current source to its discharging current source.

As seen from FIGS. 3D and 3F of the drawings, the difference between the second and fourth edges of the final pulse sequence represents the "stretched time" and when this stretched time is divided by the stretch ratio the precise time difference between the first and second edges of the final pulse sequence is ascertained. This time difference also is equal to the time difference between the first and trigger pulses. With a stretch ratio of, for example, 20:1 and 500 picosecond quantizing, the final least significant bit (LSB) is 25 picoseconds.

In accordance with the present invention, the stretch ratio of the capacitor is precisely calibrated using only data that is derived from sample pulse signals (i.e., not special calibration signals) supplied to simple time stretcher 10. If the maximum time difference expected is 100 nanoseconds, the stretch ratio must be known to be better than one part in four thousand. The stretch ratio can be calculated from the data by using the first edge time measurement, and the difference between the first and second edges of the final pulse sequence measured with 500 picosecond LSB.

From the time difference between the first and second edges of the final pulse sequence, the stretch ratio is calculated with an RMS error no worse than one part in thirty, which is the error if the time difference is the minimum allowed, e.g., 10 nanoseconds. The average RMS error is about one part in 150, and by averaging the stretch ratio using many measurements, the error can be reduced to an arbitrarily small value.

LeCroy's MTD133 time digitizer, which may be utilized as time to digital converter 20 in the present invention, mathematically reduces the error discussed above by averaging a sufficient number of measurements, but three conditions should be satisfied for the MTD133 to accomplish such. First, the times measured by the MTD133 should be random with respect to its 250 MHz clock, and there should be no correlation between the clock and the input signals. Second, the 250 MHz clock should be stable and its period should be precisely known, and the phase noise of the clock should be very small. Third, the differential non-linearity due to the interpolation of the clock period should be symmetric, and this occurs automatically since the time measurements of interest are all differences between times measured with the same measuring channel. The differential non-linearity is not canceled by the subtraction, but is forced to be symmetric which means that the distribution of errors will be symmetric and the mean of the error distribution will converge to the correct value for a large number of measurements.

The RMS error in the calculated stretch ratio is reduced approximately as one over the square root of N, where N is the number of measurements. To reduce the average error to one part in 4,000, the square root of N should be at least 27, thus requiring about 700 measurements. These measurements should be of randomly distributed time differences over the full time range expected. It is appreciated that, in accordance with the present invention, the above operations and calibration measurements are obtained using "ordinary" data that has been gathered during an experiment. Furthermore, if the measurements of actual time and stretch time are fit to a straight line, rather than simply averaging the stretch ratio, non-linearities can be detected. If the system is not linear, then the stretch ratio is different for small and large time differences, and this non-linearity can be accommodated by adjusting the fitting function, and the number of measurements required to accommodate this non-linearity depends on the nature and extent of that non-linearity.

As is appreciated, the simple time stretcher of the present invention provides good protection against data corruption by randomly occurring unrelated signals. That is, the pattern of the four edges of the final pulse sequence can be used to verify that the measurements are not corrupted. Namely, the difference between the first and second edges should be within the minimum and maximum values allowed, the difference between the second and third edges should equal the width of the trigger pulse, and the calculated stretch ratio for each individual event should be consistent with the calibrated value.

Examples of instances when a measurement will be corrupted include an event in which the trigger pulse does not overlap the first pulse but overlaps the comparator output (here, the consistency test will fail), and an event with multiple input signals during the stretching time. Further, a random event that occurs either well before or just after the trigger will provide only one pulse whose width is equal to the first pulse width plus that width times the stretch ratio. This pulse (width) is the system dead time for non-triggered input signals. For example, for a system having a 100 nanosecond maximum time difference and 20:1 stretch ratio, the maximum dead time is approximately 2.1 microseconds.

In accordance with another embodiment of the present invention, hereinafter referred to as a "long time base stretcher", the time difference between two events that are separated by more than 100 nanoseconds and less than 32 microseconds is measured. FIG. 4 is a functional block diagram of the long time base stretcher of the present invention and FIG. 5 is an exemplary circuit of the long time base stretcher, wherein a separate clock oscillator (shown in FIG. 5) supplies a clock signal CLK with a period near 10 nanoseconds, but not exactly 10 nanoseconds. It is appreciated, however, that other clock periods may be utilized. The clock should not be commensurate with the 250 MHz clock which drives time to the digital converter 40 and, in a preferred embodiment of the present invention, this clock signal has a period of 10.005 nanoseconds and has a phase slip of 5 picoseconds every cycle with respect to the 250 MHz clock. This clock period is sufficient to calibrate a 25 picosecond LSB, even if the clocks beat with a precise 5 picosecond phase slip. Clock signal CLK is illustrated in FIG. 6A of the drawings.

A first pulse, which represents the first of two events in which the time difference therebetween is measured and which is shown in FIG. 6B, is supplied to a pulse synchronizing circuit 30 which includes, for example, D flip flops 42–44, gates 46 and transistor pair 48 of FIG. 5. The pulse synchronizing circuit synchronizes the first pulse with clock CLK to produce a pulse which has a leading edge at the leading edge of the first pulse and a trailing edge at the second leading clock edge after the first pulse, as shown in FIG. 6C. As seen from FIGS. 6A–6C, the trailing edge of the synchronized pulse is "synchronized" with clock CLK. Since clock CLK has a period of 10.005 nanoseconds, the synchronized pulse varies in width from 10.05 to 20.1 nanoseconds, depending on the phase of the clock at the arrival of the first pulse.

The synchronized pulse is supplied to a time stretcher circuit 32, e.g., capacitor 50 (FIG. 5), and similar to the time stretcher circuit of FIG. 1 (i.e., time stretcher 14), time stretcher circuit 32 produces the ramp signal D shown in FIG. 6D and supplies the ramp signal D to a comparator 34 (comparator 52 in FIG. 5) which produces a comparator output signal similar to the comparator output of comparator 16 of FIG. 1 (see FIG. 3E). The comparator output is supplied to a comparator output synchronizer 36 (gate 54) which synchronizes the trailing edge of the comparator output with clock CLK to produce a second synchronized pulse, such as shown as the second pulse of FIG. 6E. The second synchronized pulse is supplied along with the first synchronized pulse (FIG. 6C) to a final pulse sequence generator 38 which combines the two pulses in an OR circuit, e.g., gate 56, to produce the pulse waveform shown in FIG. 6E. The four edges of the two pulses are supplied to time to digital converter 40.

As previously discussed, the output of comparator 34 is synchronized in circuit 36 with clock CLK. In an alternative embodiment of the present invention, the output of comparator 34 is not synchronized with clock CLK, and instead, a simple monostable is sufficient since the fourth edge of the pulse sequence shown in FIG. 6E is not utilized to derive the time difference between the first two edges of the pulse sequence (to be discussed). However, in a preferred embodiment of the present invention, the output of comparator 34 is synchronized to clock CLK in synchronizer circuit 36 to provide the advantageous result of precisely measuring the clock period of clock CLK using the times of the second and fourth edges of the pulse sequence, both of which are synchronized with clock CLK. As will be described, the clock period itself is utilized to derive the ultimate time difference between the first and trigger pulses. Furthermore, synchronizing the output of comparator 34 with clock CLK allows for a simple reset mechanism which, inter alia, can enforce a short recovery time before allowing a new first pulse to restart the measuring cycle.

Time to digital converter 40 (e.g., MTD133) converts the four edges of the pulse sequence shown in FIG. 6E to time values in a manner similar to that described previously with respect to the simple time stretcher. In the long time base stretcher, however, the time difference between the first and second edges of the pulse sequence of FIG. 6E is derived by calculating the time difference between the second and third edges (the "stretched" time) and dividing that time difference by the stretch ratio. The stretch ratio is calibrated for each channel in the time-to-digital converter using the same method described above in the simple time stretcher, and also as in the simple time stretcher case, no special calibration data is required. Furthermore, the input time and the phase of clock CLK should be random with respect to the 250 MHz clock of the time-to-digital converter. However, the long time base stretcher's stretch ratio needs to be known only to about 1 part in 1000 and since the average error for a single measurement is 1 part in 50, only four hundred random measurements are required to calibrate a channel.

The total dead time for a long time base stretcher that has a 10 nanosecond separate clock period CLK and a 20:1 stretch ratio is 450 nanoseconds maximum and 350 nanoseconds average. This dead time determines the multiple hit capability of the channel and unlike the simple time stretcher, the long time base stretcher is adapted so that each measurement cannot be corrupted by locking out other signals during the stretch time until the circuits are reset.

A second (trigger) pulse is measured the same way the first pulse is measured, possibly on a different long time base stretcher circuit and a different channel of time-to-digital converter 40. As previously discussed, the long time base stretcher measures the time difference between two events which are separated by more than 100 nanoseconds and less than 32 microseconds. The time difference between the first two edges of the pulse sequence shown in FIG. 6E is determined by a first time base stretcher circuit in the manner discussed above. Similarly, the time difference between the first two edges of a pulse sequence produced in a second time base stretcher is separately calculated. The timing diagrams of the second pulse, the synchronized pulse, the ramp signal and pulse sequence of the second time base stretcher are similar to the timing diagrams of FIGS. 6B–6E, respectively.

In the long time base stretcher, the same clock signal CLK is supplied to all of the time stretcher channels and the number of clock cycles of clock signal CLK that occur from the occurrence of the synchronizing edge time of the first pulse (the trailing edge of the synchronized pulse shown in FIG. 6C) and the synchronizing edge time of the second (trigger) pulse (similarly, the trailing edge of the synchronized pulse in the second time base stretcher) is counted.

Finally, the time difference between the occurrences of the first pulse and the second (trigger) pulse is calculated by subtracting the time measured by the second time stretcher (i.e., the time difference between the first two edges of the pulse sequence produced from the second pulse) from the time measured by the first time stretcher (i.e., the time difference between the first two edges of the pulse sequence shown in FIG. 6E), and adding the amount of time that has elapsed between the synchronizing edges of the respective time base stretchers, which is equal to the number of clock cycles counted multiplied by the precisely known clock period of clock CLK. Since the second and fourth edges of each pulse sequence are synchronized with clock CLK, and time-to-digital converter 40 converts those edges into time values, the period of clock CLK is accurately measured by averaging many measurments.

The stretch ratio is calibrated for each channel in the manner previously described. The LSB of each stretcher circuit will be different and none will be exactly 25 picoseconds, and the stretch ratio of each circuit also will be different. At the end points of the stretcher range, it is likely that there will be a "bin" with a much smaller width causing a local differential non-linearity. Since the final number is a difference of two measurements and the phase of clock CLK is random with respect to the pulses being measured, these errors simply become long tails on the error distribution and increase the final RMS error slightly.

Therefore, the final time difference between two events can be measured with an LSB of approximately 25 picoseconds over a range of up to 32 microseconds. In a preferred embodiment, clock CLK should have an accuracy of better than 1 part in two million since the LSB of the time base stretcher is limited by the accuracy and stability of this clock.

In another embodiment of the present invention, the time difference between two events is measured with very high resolution in a "very high resolution time stretcher" circuit. The very high resolution time stretcher is similar to the long time base stretcher circuit shown in block diagram form in FIG. 4, except clock signal CLK is not utilized, and instead, the input pulses (i.e., the first pulse and the second (trigger) pulse) are synchronized with the 250 MHz clock of the MTD133 (i.e., the time to digital converter). The input pulses are synchronized with the 250 MHz clock in a manner similar to that described above so as to produce respective synchronized pulses which are 4 to 8 nanoseconds long. FIG. 6C of the drawings illustrates the synchronized pulse when the clock signal of FIG. 6A is the 250 MHz clock (a 4 nanosecond period). The synchronized pulse (for both the first and trigger pulses) is stretched in the manner described above and recorded in the time to digital converter. That is, the four edges of the pulse sequence, such as shown in FIG. 6E, are converted to time values in the time to digital converter. This is quite similar to the operation of the long time base stretcher discussed above, except that the synchronized pulse (i.e., the first pulse of the pulse sequence) has a minimum width of only 4 nanoseconds which is too short for the time to digital converter to correctly record both edges thereof. In accordance with the present invention, the 4 to 8 nanosecond long synchronized pulse is supplied to the time stretcher circuit, but that pulse is lengthened by two clock periods (i.e., 8 nanoseconds) before it is supplied to the time to digital converter. Thus, the first of the two pulses in the pulse sequence that is supplied to the time to digital converter is 12 to 16 nanoseconds long, which is long enough for the time to digital converter to correctly record both of its edges. In other words, the pulse sequence supplied to the time to digital converter is similar to the pulse sequence shown in FIG. 6E, except the first pulse (which represents the time of the synchronized pulse (FIG. 6C)) is extended by an additional two clock pulses.

For a 20 to 1 stretch ratio in the very high resolution time stretcher, the dead time is 180 nanoseconds maximum, which is considerably less than the maximum dead time of 450 nanoseconds in the long time base stretcher. Also, the stretch ratio calibration of the very high resolution time stretcher can be less precise than that of the long time base stretcher, which translates into improved multiple hit capability and quicker calibration. On the other hand, the stretch ratio can be increased to reduce the final LSB of the time stretcher circuit's output. It is appreciated that the elimination of a separate clock removes any possible beating effects which produce subtle non-linearities. Thus, for a stretch ratio of 500 to 1, the final LSB is one picosecond, and since the interpolation is over only 4 nanoseconds, the stretch ratio needs to be calibrated to one part in 4000, which is the same accuracy that is required in the simple time stretcher circuit.

Although the calibration procedure for the very high resolution time stretcher circuit is slightly more complicated than for the other circuits discussed above, such calibration can be accomplished without any special calibration inputs. Also, since the trailing edge of the synchronized pulse has a fixed phase relationship with the clock, the stretch ratio cannot be measured precisely by averaging many measurements on a single channel. However, calibrating two or more channels simultaneously is possible because the leading edges of both input pulses are random with respect to the clock. Such requires fitting for the scale factor for each channel and the relative offset simultaneously, and instead of fitting the data to a two dimensional curve for a single channel, the fit is to a three dimensional surface. And this is readily generalized to calibrate many channels simultaneously.

While the present invention has been particularly shown and described in conjunction with preferred embodiments thereof, it will be readily appreciated by those of ordinary skill in the art that various changes may be made without departing from the spirit and scope of the invention.

Therefore, it is intended that the appended claims be interpreted as including the embodiments described herein, the alternatives mentioned above, and all equivalents thereto.

What is claimed is:

1. Apparatus for measuring a time interval between occurrences of first and second pulses, comprising:

means for receiving first and second pulses;

difference pulse generating means for generating a difference pulse representing a difference between said first and second pulses;

time stretching means for stretching said difference pulse in accordance with a stretch ratio to produce a stretched signal;

means for producing a compared output pulse corresponding to said stretched signal;

pulse sequence generator means for generating a pulse sequence having a plurality of edges; a first of said edges corresponding to said first pulse, a second of said edges corresponding to said second pulse, and another one of said edges corresponding to said compared output pulse;

time to digital converter means for converting times of occurrences of said first edge, said second edge and said another edge of said pulse sequence to respective first, second, and another time values, and for deriving said time interval between the received first and second pulses from said second time value, said another time value and said stretch ratio; and calibration means for calibrating the stretch ratio of said time stretching means from said first, second and another time values.

2. The apparatus of claim 1, wherein said time to digital converter means includes means for calculating a difference between said second and said another time values, and for dividing the determined difference by said stretch ratio to derive said time interval between the received first and second pulses.

3. The apparatus of claim 1, wherein said time to digital converter means includes means for calculating a difference between said second and said another time values to produce a stretched time interval representing a time length of said stretched signal; and said calibration means includes means for calculating a difference between said first and second time values to produce an unstretched time interval representing a time interval between said first and second pulses before stretching; and means for calibrating the stretch ratio from said stretched time interval and said unstretched time interval.

4. The apparatus of claim 1, wherein said calibration means calibrates the stretch ratio of said time stretching means from said first, second and another time values of a plurality of time interval measurements of a plurality of first and second pulses.

5. The apparatus of claim 4, wherein said calibration means includes means for averaging the stretch ratio of a plurality of time interval measurements to produce a calibrated stretch ratio.

6. the apparatus of claim 1, wherein said difference pulse generating means includes means for inverting said second pulse to produce an inverted second pulse; and means for logically multiplying said first pulse and the inverted second pulse to produce said difference pulse.

7. The apparatus of claim 1, wherein said means for producing a compared output pulse includes means for comparing said stretched signal to a predetermined resting value and for producing said compared output signal corresponding to when said stretched signal is greater than said predetermined resting value.

8. The apparatus of claim 1, wherein said first edge of said pulse sequence corresponds to a time of occurrence of a leading edge of said first pulse, said second edge of said pulse sequence corresponds to a time of occurrence of a leading edge of said second pulse, and said another one of said edges of said pulse sequence corresponds to a trailing edge of said compared output pulse.

9. The apparatus of claim 1, wherein said time to digital converter means includes means for receiving a stop signal after the pulse sequence is generated; and means for ascertaining respective time differences between said first edge, said second edge and said another edge of said pulse sequence and said stop signal to produce said first, second and another time values.

10. Apparatus for measuring a time interval between occurrences of first and second pulses, comprising:

means for receiving a first pulse, a second pulse and a clock signal, said clock signal having a predetermined known period;

synchronizing means for synchronizing the first received pulse with said clock signal to produce a first synchronized pulse, and for synchronizing the second received pulse with said clock signal to produce a second synchronized pulse;

means for determining an elapsed number of clock periods between occurrences of the first synchronized pulse and the second synchronized pulse;

time stretching means for stretching said first synchronized pulse in accordance with a first stretch ratio to produce a first stretched signal, and for stretching said second synchronized pulse in accordance with a second stretch ratio to produce a second stretched signal;

compared output means for producing a first compared output: pulse corresponding to said first stretched signal, and for producing a second compared output pulse corresponding to said second stretched signal;

compared output synchronizing means for synchronizing the first compared output pulse with said clock signal to produce a first synchronized compared output pulse, and for synchronizing the second compared output pulse with said clock signal to produce a second synchronized compared output pulse;

pulse sequence generator means for generating a first pulse sequence from the first synchronized pulse and the first synchronized compared output pulse, and for generating a second pulse sequence from the second synchronized pulse and the second synchronized compared output pulse;

time to digital converter means for converting times of occurrences of each of said edges of said first pulse sequence to respective time values; for converting times of occurrences of each of said edges of said second pulse sequence to other respective time values; and for deriving said time interval between the received first and second pulses from said time values and from said other time values, the first and second stretch ratios, the period of the clock and the elapsed number of clock periods; and calibration means for calibrating the first stretch ratio from said time values, and for calibrating the second stretch ratio from said other time values.

11. The apparatus of claim 10, wherein said means for receiving receives said first pulse on a first channel of said apparatus and receives said second pulse on a second channel of said apparatus; and each of said means of said apparatus utilizes the same received clock signal.

12. The apparatus of claim 10, wherein said time to digital converter means converts times of occurrences of first, second, third and fourth edges of said first pulse sequence to first, second, third and fourth time values, respectively; and converts times of occurrences of first, second, third and fourth edges of said second pulse sequence to fifth, sixth, seventh and eighth time values, respectively.

13. The apparatus of claim 12, wherein said time to digital converter means is operable to derive said time interval between the received first and second pulses from the second, third, sixth and seventh time values, the first and second stretch ratios, the period of the clock and the elapsed number of clock periods.

14. The apparatus of claim 12, wherein said calibration means calibrates the first stretch ratio from said first, second and third time values, and calibrates the second stretch ratio from said fifth, sixth and seventh time values.

15. The apparatus of claim 12, wherein said time to digital converter means includes calculating means for deriving a length in time of said first synchronized pulse from said second time value, said third time value and said first stretch ratio; for deriving a length in time of said second synchronized pulse from said sixth time value, said seventh time value and said second stretch ratio; for multiplying the period of the clock and the elapsed number of clock periods to produce a time interval between a synchronized edge of said first synchronized pulse and a synchronized edge of said second synchronized pulse; and for deriving said time interval between the received first and second pulses from the lengths in time of said first and second synchronized pulses, and said time interval between the synchronized edges of said first and second synchronized pulses.

16. The apparatus of claim 15, wherein said calculation means of said time to digital converter means is operable to calculate a difference between said second and third time values, and to divide the determined difference by said first stretch ratio to derive said length in time of said first synchronized pulse; is operable to calculate a difference between said sixth and seventh time values, and to divide this determined difference by said second stretch ratio to derive said length in time of said second synchronized pulse; and to derive said time interval between the received first and second pulses by subtracting the length in time of said second synchronized pulse from the length in time of said first synchronized pulse and adding thereto said time interval between the synchronized edges of said first and second synchronized pulses.

17. The apparatus of claim 12, wherein said synchronizing means produces said first synchronized pulse having a leading edge corresponding to the first received pulse and a trailing edge synchronized with an edge of one pulse of said clock signal; and produces said second synchronized pulse having a leading edge corresponding to the second received pulse and a trailing edge synchronized with an edge of another pulse of said clock signal.

18. The apparatus of claim 17, wherein said time to digital converter means includes means for calculating a difference between said second and third time values to produce a first stretched time interval representing a time length of said first stretched signal; and for calculating a difference between said sixth and seventh time values to produce a second stretched time interval representing a time length of said second stretched signal; and said calibration means includes means for calculating a difference between said first and second time values to produce a first unstretched time interval representing a length in time of said first synchronized pulse before stretching; for calculating a difference between said fifth and sixth time values to produce a second unstretched time interval representing a length in time of said second synchronized pulse before stretching; and means for calibrating the first stretch ratio from said first stretched time interval and said first unstretched time interval, and for calibrating the second stretch ratio from said second stretched time interval and said second unstretched time interval.

19. The apparatus of claim 17, wherein said means for determining counts said elapsed number of clock periods between the synchronized edge of said one pulse and the synchronized edge of said another pulse of said clock signal.

20. The apparatus of claim 17, further comprising means for accurately measuring the number of periods of said clock signal from said second, fourth, sixth and eighth time values and said predetermined known period.

21. The apparatus of claim 10, wherein said calibration means calibrates the first stretch ratio and the second stretch ratio from time values of a plurality of time interval measurements of a plurality of first and second pulses.

22. The apparatus of claim 10, wherein said time to digital converter means generates each of said time values in accordance with a clock signal, and is further operable to supply said clock signal to said means for receiving.

23. The apparatus of claim 10, wherein said pulse sequence generator means includes a first summing circuit for combining the first synchronized pulse and the first synchronized compared output pulse to produce the first pulse sequence, and a second summing circuit for combining the second synchronized pulse and the second synchronized compared output pulse to produce the second pulse sequence.

24. The apparatus of claim 10, wherein said time to digital converter means includes means for receiving a stop signal; means for ascertaining respective time differences between first, second, third and fourth edges of said first pulse sequence and said stop signal to produce first, second, third and fourth time values; and means for ascertaining respective time differences between first, second, third and fourth edges of said second pulse sequence and said stop signal to produce fifth, sixth, seventh and eighth time values.

25. Method of measuring a time interval between occurrences of first and second pulses, comprising the steps of:
receiving first and second pulses;
generating a difference pulse representing a difference between said first and second pulses;
stretching said difference pulse in accordance with a stretch ratio to produce a stretched signal;
producing a compared output pulse corresponding to said stretched signal;
generating a pulse sequence having a plurality of edges; a first of said edges corresponding to said first pulse, a second of said edges corresponding to said second pulse, and another one of said edges corresponding to said compared output pulse;
converting times of occurrences of said first edge, said second edge and said another edge of said pulse sequence to respective first, second, and another time values;
deriving said time interval between the received first and second pulses from said second time value, said another time value and said stretch ratio; and
calibrating the stretch ratio from said first, second and another time values.

26. The method of claim 25, wherein said deriving step is carried by calculating a difference between said second and said another time values, and dividing the determined difference by said stretch ratio to derive said time interval between the received first and second pulses.

27. The method of claim 25, wherein said deriving step includes the step of calculating a difference between said second and said another time values to produce a stretched time interval representing a time length of said stretched signal; and said calibration step is carried out by calculating a difference between said first and second time values to produce an unstretched time interval representing a time interval between said first and second pulses before stretching, and calibrating the stretch ratio from said stretched time interval and said unstretched time interval.

28. The method of claim 25, wherein said calibration step is carried out by calibrating the stretch ratio from said first, second and another time values of a plurality of time interval measurements of a plurality of first and second pulses.

29. The method of claim 28, wherein said calibration step is carried out by averaging the stretch ratio of a plurality of time interval measurements to produce a calibrated stretch ratio.

30. The method of claim 25, wherein said step of generating a difference pulse is carried out by inverting said second pulse to produce an inverted second pulse, and logically multiplying said first pulse and the inverted second pulse to produce said difference pulse.

31. The method of claim 25, wherein said step of producing a compared output pulse is carried out by comparing said stretched signal to a predetermined resting value and producing said compared output signal corresponding to when said stretched signal is greater than said predetermined resting value.

32. The method of claim 25, wherein said first edge of said pulse sequence corresponds to a time of occurrence of a leading edge of said first pulse, said second edge of said pulse sequence corresponds to a time of occurrence of a leading edge of said second pulse, and said another one of said edges of said pulse sequence corresponds to a trailing edge of said compared output pulse.

33. The method of claim 25, wherein said converting step includes the steps of receiving a stop signal after the pulse sequence is generated, and ascertaining respective time differences between said first edge, said second edge and said another edge of said pulse sequence and said stop signal to produce said first, second and another time values.

34. Method of measuring a time interval between occurrences of first and second pulses, comprising the steps of;
receiving a first pulse and a clock signal, said clock signal having a predetermined known period;
synchronizing the first received pulse with said clock signal to produce a first synchronized pulse;
stretching said first synchronized pulse in accordance with a first stretch ratio to produce a first stretched signal;
producing a first compared output pulse corresponding to said first stretched signal;
synchronizing the first compared output pulse with said clock signal to produce a first synchronized compared output pulse;
generating a first pulse sequence from the first synchronized pulse and the first synchronized compared output pulse;
converting times of occurrences of each of said edges of said first pulse sequence to respective time values;
receiving a second pulse;
synchronizing the second received pulse with said clock signal to produce a second synchronized pulse;
stretching said second synchronized pulse in accordance with a second stretch ratio to produce a second stretched signal;
producing a second compared output pulse corresponding to said second stretched signal;
synchronizing the second compared output pulse with said clock signal to produce a second synchronized compared output pulse;
generating a second pulse sequence from the second synchronized pulse and the second synchronized compared output pulse;
converting times of occurrences of each of said edges of said second pulse sequence to other respective time values;
determining an elapsed number of clock periods between occurrences of synchronized edges of the first synchronized pulse and the second synchronized pulse;
deriving said time interval between the received first and second pulses from the time values and the other time values, the first and second stretch ratios, the period of the clock and the elapsed number of clock periods;

calibrating the first stretch ratio from said time values; and calibrating the second stretch ratio from said other time values.

35. The method of claim 34, wherein said first receiving step receives said first pulse on a first channel; said second receiving step receives said second pulse on a second channel; and each of said steps is carried out using the same received clock signal.

36. The method of claim 34, wherein said first converting step is carried out by converting times of occurrences of first, second, third and fourth edges of said first pulse sequence to first, second, third and fourth time values, respectively; and said second converting step is carried out by converting times of occurrences of first, second, third and fourth edges of said second pulse sequence to fifth, sixth, seventh and eighth time values, respectively.

37. The method of claim 36, wherein said step of deriving is carried out by deriving said time interval between the received first and second pulses from the second, third, sixth and seventh time values, the first and second stretch ratios, the period of the clock and the elapsed number of clock periods between the synchronized edges of the first and second synchronized pulses.

38. The method of claim 36, wherein said first calibration step is carried out by calibrating the first stretch ratio from said first, second and third time values; and said second calibration step is carried out by calibrating the second stretch ratio from said fifth, sixth and seventh time values.

39. The method of claim 36, wherein said step of deriving said time interval includes the steps of deriving a length in time of said first synchronized pulse from said second time value, said third time value and said first stretch ratio; deriving a length in time of said second synchronized pulse from said sixth time value, said seventh time value and said second stretch ratio; multiplying the period of the clock and the elapsed number of clock periods to produce a time interval between a synchronized edge of said first synchronized pulse and a synchronized edge of said second synchronized pulse; and deriving said time interval between the received first and second pulses from the lengths in time of said first and second synchronized pulses, and said time interval between the synchronized edges of said first and second synchronized pulses.

40. The method of claim 39, wherein said step of deriving said time interval is carried out by calculating a difference between said second and third time values, dividing the determined difference by said first stretch ratio to derive said length in time of said first synchronized pulse, calculating a difference between said sixth and seventh time values, dividing this determined difference by said second stretch ratio to derive said length in time of said second synchronized pulse, and deriving said time interval between the received first, and second pulses by subtracting the length in time of said second synchronized pulse from the length in time of said first synchronized pulse and adding thereto said time interval between the synchronized edges of said first and second synchronized pulses.

41. The method of claim 36, wherein said first synchronizing step is carried out by producing said first synchronized pulse having a leading edge corresponding to the first received pulse and a trailing edge synchronized with an edge of one pulse of said clock signal; and said second synchronizing step is carried out by producing said second synchronized pulse having a leading edge corresponding to the second received pulse and a trailing edge synchronized with an edge of another pulse of said clock signal.

42. The method of claim 41, wherein said step of deriving said time interval is carried out by calculating a difference between said second and third time values to produce a first stretched time interval representing a time length of said first stretched signal; and calculating a difference between said sixth and seventh time values to produce a second stretched time interval representing a time length of said second stretched signal; said first calibration step is carried out by calculating a difference between said first and second time values to produce a first unstretched time interval representing a length in time of said first synchronized pulse before stretching, and calibrating the first stretch ratio from said first stretched time interval and said first unstretched time interval; and said second calibration step is carried out by calculating a difference between said fifth and sixth time values to produce a second unstretched time interval representing a length in time of said second synchronized pulse before stretching, and calibrating the second stretch ratio from said second stretched time interval and said second unstretched time interval.

43. The method of claim 41, wherein said step of determining is carried out by counting said elapsed number of clock periods between the synchronized edge of said one pulse and the synchronized edge of said another pulse of said clock signal.

44. The method of claim 41, further comprising the step of accurately measuring the number of periods of said clock signal from said second, fourth, sixth and eighth time values and said predetermined known period.

45. The method of claim 34, wherein said first and second calibration steps calibrate the respective first and second stretch ratios from time values of a plurality of time interval measurements of a plurality of first and second pulses.

46. The method of claim 34, wherein both said converting steps generate said time values in accordance with a clock signal; said method further comprising the step of supplying said clock signal as the received clock signal.

47. The method of claim 34, wherein said step of generating a first pulse sequence is carried out by summing the first synchronized pulse and the first synchronized compared output pulse; and said step of generating a second pulse sequence is carried out by summing the second synchronized pulse and the second synchronized compared output pulse.

48. The method of claim 34, wherein said first converting step includes the steps of receiving a stop signal, and ascertaining respective time differences between first, second, third and fourth edges of said first pulse sequence and said stop signal to produce first, second, third and fourth time values; and said second converting step includes the step of ascertaining respective time differences between first, second, third and fourth edges of said second pulse sequence and said stop signal to produce fifth, sixth, seventh and eighth time values.

* * * * *